United States Patent [19]  
van Gastel et al.

[11] Patent Number: 4,532,884  
[45] Date of Patent: Aug. 6, 1985

[54] DEVICE FOR APPLYING A FIXING MEDIUM TO COMPONENTS SUCH AS CHIP-TYPE COMPONENTS

[75] Inventors: Josephus M. M. van Gastel; Hendrikus T. van Nunen; Leonardus C. M. Sanders, all of Eindhoven, Netherlands

[73] Assignee: U.S. Philips Corporation, New York, N.Y.

[21] Appl. No.: 598,634

[22] Filed: Apr. 10, 1984

[30] Foreign Application Priority Data

Nov. 4, 1983 [NL] Netherlands .................. 8303797

[51] Int. Cl.³ .............................................. B05C 1/00
[52] U.S. Cl. ................................. 118/243; 118/220; 118/225; 118/211; 228/36
[58] Field of Search ............... 118/211, 213, 216, 220, 118/225, 243, 253, 255, 263; 228/7, 36; 29/739, 740; 156/578

[56] References Cited  
U.S. PATENT DOCUMENTS 3,172,781  3/1965  Grill ................................... 118/211  
4,375,126  3/1983  Düll et al. ........................... 29/740

FOREIGN PATENT DOCUMENTS 71303    2/1983  European Pat. Off. .  
2935082  3/1981  Fed. Rep. of Germany ........ 29/740

Primary Examiner—Norman Morgenstern  
Assistant Examiner—Ken Jaconetty  
Attorney, Agent, or Firm—David R. Treacy

[57] ABSTRACT

A device for applying a fixing medium to electronic chip-type components, comprising a container with a number of stamps arranged in one row and displaceable in vertical direction. Each of these stamps consists of a stamp pin which is identical for all stamps, and an exchangeable attachment with a stamp head adapted to the components. The container is closed on the upper side by a cover plate provided with holes, on which exchangeable and displaceable supporting plates are mounted by means of magnets, each supporting plate comprising several openings adapted to the components. The cover plate and the supporting plates have guides and positioning means for positioning the supporting plates with respect to the stamps.

10 Claims, 7 Drawing Figures

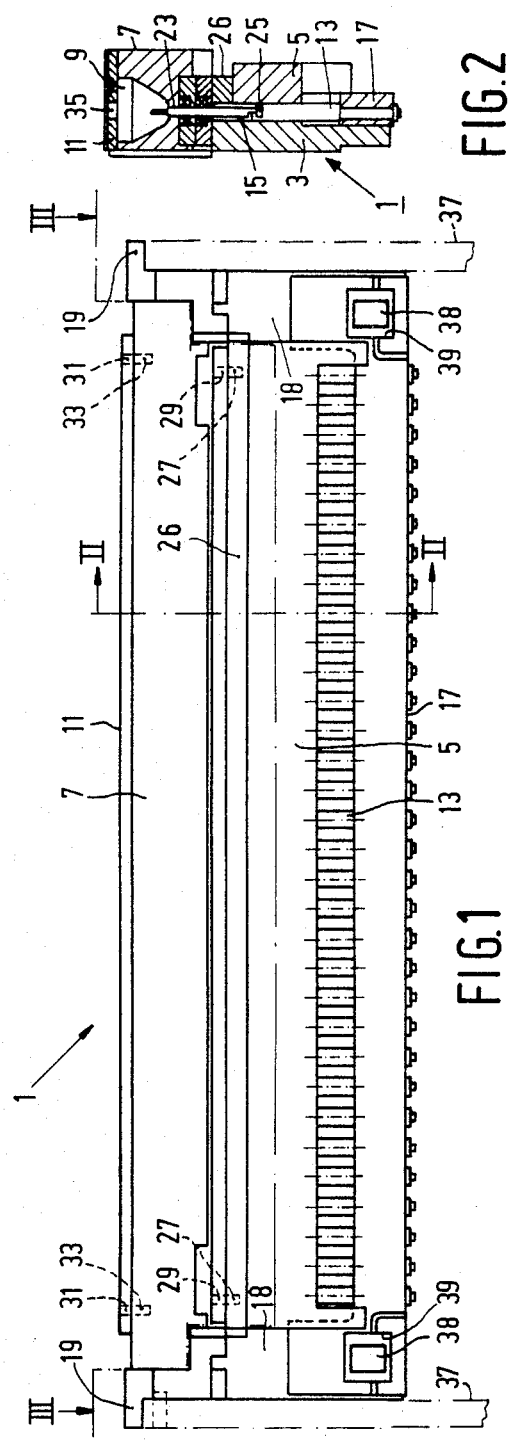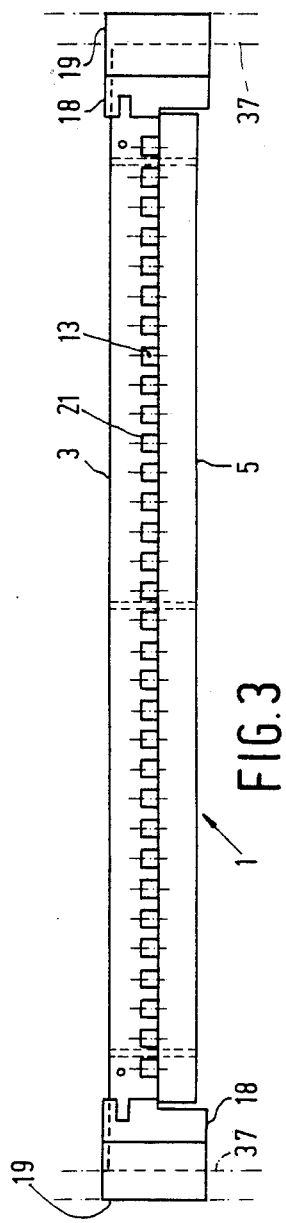
FIG.1 FIG.2 FIG.3

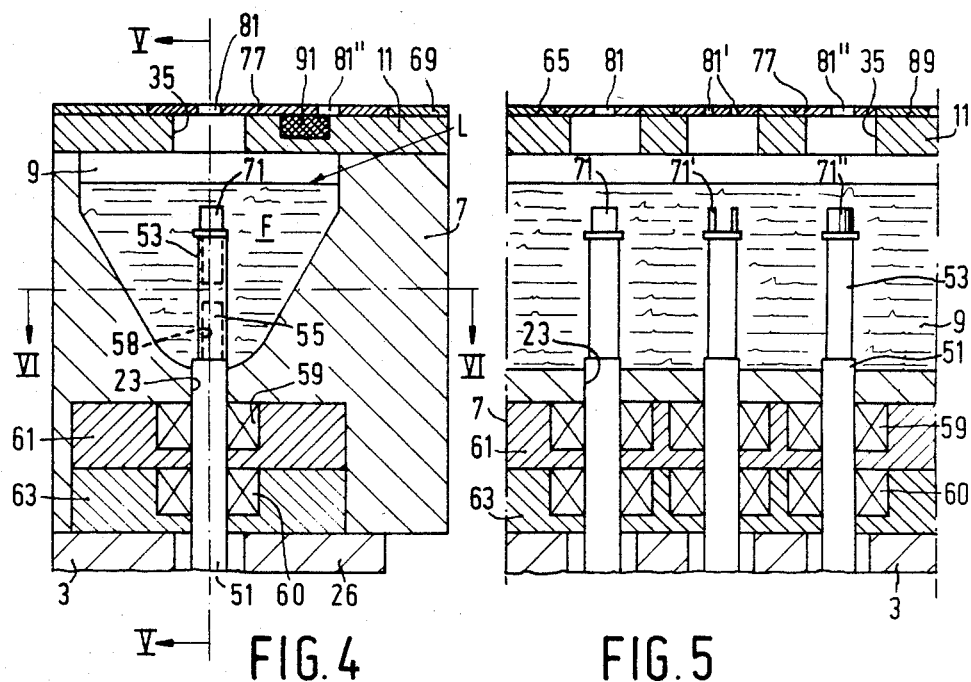
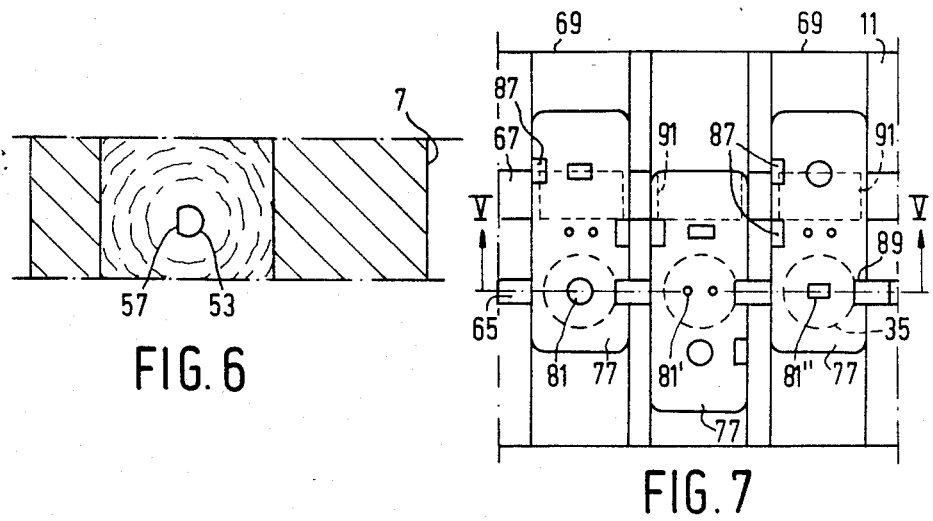

DEVICE FOR APPLYING A FIXING MEDIUM TO COMPONENTS SUCH AS CHIP-TYPE COMPONENTS

BACKGROUND OF THE INVENTION

The invention relates to a device for applying a viscous fixing medium to electronic components, more particularly to chip-type components, comprising an elongate bin with a container for the medium, and a plurality of stamps the stamp heads of which are directed vertically upwards and which are arranged in a regular geometric pattern, their lower ends being coupled to a common driving element. The stamps are displaceable in a vertical direction between a lower rest position in which each stamp head is situated in the container below the level of the medium, and an upper working position in which each stamp head projects above the container.

Such a device is known from European Patent Application EP No. 0 071 303 A1, to which U.S. Pat. No. 4,480,780 corresponds. This known device serves to apply glue simultaneously to the lower side of a plurality of electronic chip-type components, which have been temporarily brought to a standstill over a bin containing a fixing medium and which are positioned with respect to the stamps. In this known device, all stamps are identical, are rigidly secured to a driving rod and have a stamp head of the same shape.

The range of chip-type electronic components, without the conventional comparatively long connection wires and suitable to be mounted on substrates devoid of holes, becomes gradually wider. An increasing number of types and kinds of components are adapted for so-called surface mounting on substrates devoid of holes. The variety of chip-type components, both with regard to type and with regard to shape and dimensions, still increases. As to the dimensions of the components to be processed, dimensions are to be considered which lie in the millimeter range; a frequently occurring type has the dimensions of $0.8 \times 1.6 \times 3.2$ mm. As to their shape, the chip-type components can also be greatly different: the most frequently occurring components are block- or plate-shaped; however, cylindrical components are also known.

As is known and as has been described in the aforementioned European Patent Application EP No. 0 071 303 A1, these components are fixed temporarily onto the substrate by means of a fixing medium before they are soldered ultimately on the substrate. For this purpose, a quantity of fixing medium is applied to the lower side of the chip-type components by means of the device known from the European Patent Application. It has now been found that specific requirements apply to every kind of chip-type components as to the shape and the volume of the applied quantity of fixing medium; it has been found in practice that, in order to obtain a reliable adhesion of the component to the substrate, without the track pattern on the substrate being contaminated with the fixing medium, for every kind of chip-type components a given optimum quantity of fixing medium is necessary, which has to be applied to the component in a given form. These requirements cannot be satisfied when the known device is used.

SUMMARY OF THE INVENTION

The present invention has for its object to provide a device by means of which it is possible to apply a fixing medium to various electronic components, more particularly chip-type components, simultaneously in a reproducible manner, in a metered quantity and in a given form which are optimal and specific for each type and kind; and to adapt the device in a simple manner to a variety of components to be processed.

According to the invention, this object is mainly achieved in that the stamps are of multipartite construction and each have a stamp pin which is identical for all stamps and which cooperates with the driving element, as well as an exchangeable attachment which is provided on the upper end of the stamp pin and which comprises the stamp head.

Due to the exchangeability of the attachment, each stamp can be provided in a simple manner with an attachment whose stamp head has a shape which is specific for the component supplied in the relevant stamp position and to be provided with a fixing medium; and the stamp head is shaped so that the fixing medium is applied in an optimum quantity for this component and in a form specific for this component. A smaller quantity of the fixing medium is applied to components having a comparatively small base surface, than to components having a larger base surface. Heavier components require a larger quantity of the fixing medium than lighter components. The fixing medium can be applied to components having an elongate base surface in the form of an elongate drop, while the overall quantity of fixing medium to be applied can be applied in a single large drop or in several small drops, depending upon the dimensions of the base surface of the component. Moreover, the track pattern on the substrate on which the components will be ultimately arranged can be taken into account as well; the fixing medium is applied to the component in such a manner that the possibility of contamination of the track pattern on the substrate is a minimum.

By exchange of the attachments, the device can be reassembled and adapted simply and rapidly to various products, that is to say to different series of components to be arranged and to various substrates to be provided with components.

It should be noted that as a fixing medium use may be made of glue, a glue component, an activator, soldering paste and the like.

A preferred embodiment of the device according to the invention is characterized in that the bottom of the container is provided with bores in which the stamp pins are slidable and in that the container is closed on the upper side by means of a cover plate provided with holes, one hole in line with each stamp.

As described in the aforementioned European Patent Application EP No. 0 071 303 A1, the components to be placed on a substrate are taken up, transported and placed by means of pick-ups; in order to apply a fixing medium to the lower side of the components, the pick-ups with the components are brought to a standstill over a container open on the upper side. The stamps are displaced from their rest position upwards into their working position, take along a quantity of the fixing medium surrounding the stamp head as a cone during their displacement, and deposit a part of the fixing medium taken along on the lower side of the components and finally return to their rest position.

When now according to the measure in accordance with the invention the upper side of the container is closed by means of a cover plate provided with holes, the components can be arranged by the pick-ups on the cover plate and can be pressed against the cover plate. All components are located with their lower side in the same horizontal plane, that is, the upper surface of the cover plate which serves as a reference plane. When the cover plate is used as a reference element, the reproducibility of the process of applying a fixing medium is increased. The transverse dimensions of the holes in the cover plate are identical and generally larger than the cross-section of the thickest stamp head. At any rate, the holes in the cover plate are dimensioned so that all stamps with their stamp heads and the fixing medium adhering thereto can pass through them and that contamination and clogging with fixing medium are avoided; however, the holes must not be so large that the components are not supported.

In a further preferred embodiment of the device according to the invention, exchangeable supporting plates are provided on the cover plate. The overall shape and the dimensions of the plates are identical and are selected to overlap the holes in the cover plate. Each supporting plate is provided with at least one opening having such a shape and such dimensions that the stamp head of the relevant stamp can pass through it. The cover plate and the supporting plates are also provided with guides and positioning means for positioning the supporting plates with respect to the stamps.

When the device is provided with exchangeable supporting plates, on which the components will be located, an individual supporting plate can be arranged in the relevant position for every type of component with an opening specific for this component. The opening in the supporting plate is dimensioned and profiled so that on the one hand the component is supported sufficiently and cannot drop through the opening, whereas on the other hand the opening is sufficiently large that the fixing medium on the stamp head of the relevant stamp can reach the lower side of the component without contact between the plate or the opening walls and the fixing medium. Due to the specific opening in the supporting plate, this measure offers the possibility of sufficiently supporting also very small components during the application of a fixing medium.

The high degree of flexibility of the device obtained by the aforementioned measures is further increased by the exchangeability of the supporting plates, as a result of which it is possible to arrange the most suitable supporting plate for the relevant component in every stamp position. The exchange of the supporting plates will generally be associated with the exchange of the attachments of the stamps.

A further increase of the flexibility is obtained in a further preferred embodiment of the device according to the invention in that the supporting plates are provided with several openings having different shapes and dimensions and can be displaced and positioned in a corresponding number of positions. In order to readjust the device to another series of components, the supporting plates need only change their positions, at least as far as the most frequently used components are concerned. When each supporting plate is provided with several openings, the number of supporting plates to be stored is restricted.

Due to the fact that in a further preferred embodiment of the device according to the invention the cover plate is provided with magnet elements for holding the supporting plates, the readjustment and exchange of the supporting plates can take place very rapidly and efficiently.

By the aforementioned measures, a device for applying a fixing medium to electronic components, more particularly chip-type components, is obtained which is universal, that is it is suitable for processing a wide range of chip-type components of different shapes and dimensions, is moreover very flexible, and in view of the exchangeability of various elements can be readjusted and adapted in a simple and efficient manner.

The invention will be described more fully with reference to the drawing.

BRIEF DESCRIPTION OF THE DRAWING

FIG. 1 shows in front elevation an embodiment of the device according to the invention, FIG. 2 shows the device in cross-section taken on the line II—II in FIG. 1, FIG. 3 is a longitudinal sectional view of the device taken on the line III—III in FIG. 1, FIG. 4 shows in partial cross-sectional view the device on an enlarged scale, FIG. 5 is a partial longitudinal sectional view of the device taken on the line V—V in FIG. 4, FIG. 6 is a sectional view of the device taken on the line VI—VI in FIG. 4, FIG. 7 is a plan view of the device shown in FIGS. 4 and 5.

DESCRIPTION OF THE PREFERRED EMBODIMENT

First the general construction of the device will be described with reference to FIGS. 1 to 3. The device 1 mainly comprises a supporting block 3, a closure block 5, a bin 7 with a container 9 closed on the upper side by a cover plate 11, a number of push rods 13 with stamps 15, a driving beam 17 and side flanges 18 with suspension flanges 19. At regular distances, grooves 21 are provided in the supporting block 3, which are closed over part of their length by the closure block 5 and serve to guide the push rods 13. Due to the fact that the grooves 21 and the push rods 13 have a square cross-section, the push rods are locked against rotation. The push rods 13 are connected by their lower ends to the common driving beam 17 which is displaceable vertically with respect to the supporting block 3 and the closure block 5. The bin 7 is supported by the supporting block 3 and the closure block 5 and is positioned with respect to these parts by means of positioning pins 27 on the supporting block 3 which co-operate with positioning holes 29 on the bin 7. The bottom of the bin 7 is provided with bores 23 which serve to guide the stamps 15 which are coupled by means of a hook connection 25 in a detachable manner to the push rods 13, and in such a manner that the stamps 15 are locked against rotation. Reference numeral 26 denotes a covering strip which can be removed so that in the working position of the stamps 15 the hook connections 25 are accessible and the stamps 15 can be uncoupled from the push rods 13. The cover plate 11 is positioned with respect to the bin by means of positioning holes 31 co-operating with positioning pins 33 on the bin 7. The cover plate 11 is provided with a series of holes 35, one in line with each stamp. By means of the suspension flanges 19, the device can be mounted in a frame designated by 37, for example the frame of a device as described in the aforementioned European Patent Application. The driving beam 17 is driven from a drive, not shown, in a vertical direction in a reciprocating movement by means of rollers 38 which co-operate with recesses 39 in the driving beam.

A number of essential elements will be described more fully with reference to FIGS. 4 to 7. The stamps 15 are of bipartite construction and comprise a stamp pin 51 which is identical for all stamps and has a circular cross-section, which is detachably coupled by means of the hook connection 25 to the relevant push rod 13, and an exchangeable cylindrical attachment 53 which is fixed in a detachable manner, for example with clamping fit, on an end portion 55 of the stamp pin 51. By providing the attachment and the end portion with a flattened part 57 and 58, respectively, a form connection is established between these two parts such that the attachment 53 is also locked against rotation. The attachments 53 can be exchanged without removing the bin 7; only the cover plate 11 has to be removed. The bin 7, which is filled up to the level L with a viscous fixing medium F, is sealed on the lower side by means of two sleeves 59 and 60; the sleeve 59 is journalled in a sleeve holder 61 which is connected to the bin 7, while the sleeve 60 is arranged in a sleeve holder 63 which is connected to the supporting block 3. Due to the presence of the sleeve 59, fixing medium is prevented from leaking away along the stamps.

The bin 7 can be removed from the device, for example for periodic cleaning, without the necessity of removing the stamps 15 with their attachments 53. This is possible due to the fact that the maximum diameter of the cylindrical attachment 53 is smaller than or equal to the maximum diameter of the stamp pin 51 so that this bipartite assembly can pass through the opening of the sleeve 59 when the bin 7 is removed in upward direction.

The sleeve 60 protects the driving mechanism from any leaking fixing medium when the bin 7 has been removed.

Each attachment 53 has secured on it a stamp head which has a given shape and is specific for a given component, for example, a stamp head 71 having a cylindrical profile, a stamp head 71' having two pins, a stamp head 71" having a rectangular profile, and the like.

The holes 35 in the cover plate 11 have a diameter which is larger than the maximum transverse dimensions of the attachments 53. The cover plate 11 is provided on the upper side with a narrow longitudinal groove 65, with a wider longitudinal groove 67 and with transverse grooves 69 at regular distances, one groove in each stamp position. A supporting plate 77 is arranged in each transverse groove 69. All supporting plates have the same outer periphery and are provided with a number of different openings, in the embodiment shown with a circular opening 81, with two cylindrical openings 81', with a rectangular opening 81", and the like. Recesses 87 are provided at the outer periphery of the supporting plates 77, one recess beside each opening. The recesses 87 cooperate with cams 89 which are secured, for example by means of glue, in the narrow longitudinal groove 65. These recesses and cams serve for the correct positioning of the supporting plates 77 in such a manner that one of the openings is located in line with the relevant stamp 15, whose stamp head has a profile corresponding to the profile of the opening in the supporting plate; thus, the stamp with the cylindrical stamp head 71 co-operates with the circular opening 81 in the supporting plate 77; the stamp head 71' having two pins co-operates with the cylindrical openings 81' and the rectangular stamp head 71" co-operates with the rectangular opening 81". The openings 81, 81' and 81" are proportioned so that the stamp head substantially reaches the lower side of a component bearing on the supporting plate, whereby the fixing medium surrounding the stamp head as a cone comes into touch with the component without the inner wall of the opening coming into touch with the fixing medium.

At regular distances, there are secured in the wide longitudinal groove 67 small plate-shaped magnets 91, for example by means of glue, one in each stamp position. These magnets 91 serve to hold the supporting plates 77, which can be brought into another position or can be exchanged in a simple manner.

For applying a quantity of the fixing medium F to a number of chip-type components, the components supplied in one row are arranged on the supporting plates 77, one component on each supporting plate; the stamp heads and the supporting plates have been chosen and arranged beforehand in such a manner that in each position a stamp head specific for the relevant component cooperates with a corresponding opening in the supporting plate, which is also specific for this component. The components are now located with their lower sides in the same plane. Subsequently, the stamps 15 are moved simultaneously upwards by means of the driving beam 17 and the push rods 13 from the rest position shown in FIG. 4, in which the stamp heads are immersed completely in the fixing medium F present in the container 9, to a working position in which the stamp heads are located with their upper sides immediately below and near the lower side of the components, a quantity of fixing medium taken along by the stamps being transferred from the upper side of the stamp heads to the lower side of the components. The stamps are then returned downwards to the rest position. The components provided with fixing medium are lifted from the cover plate and transported further.

The container 9 has a cross-section decreasing towards the bottom, as a result of which on the one hand the required quantity of fixing medium in the container up to the average level L remains limited, whereas on the other hand an excessively rapid fall of the level is avoided.

What is claimed is:

1. A device for applying a viscous medium simultaneously to the lower side of each of a plurality of components, comprising a container having a bottom, for containing a quantity of viscous medium filling the container at least to a given level, a plurality of stamps, each having a respective stamp head, arranged in a regular geometric pattern, and means for simultaneously displacing said stamps from a lower rest position, in which each stamp head is below said level, to an upper working position in which each stamp head projects above the container, characterized in that each stamp comprises a respective one of a plurality of identical stamp pins each having an upper end and a lower end, elongated in the displacement direction; and a respective exchangeable attachment disposed on the respective pin upper end, said attachment comprising the stamp head, said means for displacing engages the respective lower ends of the stamp pins, the device further comprises means for preventing rotation of said pins about an axis parallel to the displacement direction, and said container further comprises a cover having a corresponding plurality of identical openings arranged in said pattern, aligned with said pins, each opening having a size permitting passage therethrough of the largest cross-section attachment; and means for supporting said plurality of components in line with respective openings in the cover.

2. A device as claimed in claim 1, characterized in that said container bottom has a corresponding plurality of identical bores arranged in said pattern, a respective stamp pin passing slidably through each bore, and common driving element is disposed below said container and is aligned with said bores.

3. A device for applying a viscous medium simultaneously to the lower side of each of a plurality of components, comprising a container having a bottom, for containing a quantity of viscous medium filling the container at least to a given level, a plurality of stamps, each having a respective stamp head, arranged in a regular geometric pattern, and means for simultaneously displacing said stamps from a lower rest position, in which each stamp head is below said level, to an upper working position in which each stamp head projects above the container, characterized in that each stamp comprises a respective one of a plurality of identical stamp pins each having an upper end and a lower end, elongated in the displacement direction; and a respective exchangeable attachment disposed on the respective pin upper end, said attachment comprising the stamp head, said means for displacing engages the respective lower ends of the stamp pins, the device further comprises means for preventing rotation of said pins about an axis parallel to the displacement direction, said container further comprises a cover having a corresponding plurality of identical openings arranged in said pattern, aligned with said pins, and a respective exchangeable component supporting plate associated with each cover opening, supported on said cover, each cover opening has a size permitting passage therethrough of the largest cross-section attachment, and each of said exchangeable supporting plates has identical overall dimensions arranged to overlap respective openings in said cover, each plate having at least one opening have a shape and dimensions selected to permit the corresponding stamp head to pass therethrough without contact between the supporting plate and any medium clinging to said corresponding stamp head.

4. A device as claimed in claim 3, characterized in that each plate includes means for supporting one component arranged with a lower side, to which viscous medium is to be applied, in line with the opening in the plate.

5. A device as claimed in claim 4, characterized in that each plate has a plurality of openings having different cross-sections to match respective stamp heads, and the device comprises means for aligning each plate with a selected plate opening in line with the respective stamp.

6. A device as claimed in claim 5, characterized in that said plurality of openings in a plate are arranged in a line, and said means for aligning comprises a respective groove, in which a respective plate is slidable, associated with each respective cover opening.

7. A device as claimed in claim 6, characterized in that said plates each comprise at least a magnetic portion, and said cover comprises magnet element means for holding the supporting plates in position.

8. A device as claimed in claim 3, characterized in that each plate has a plurality of openings having different cross-sections to match respective stamp heads, and the device comprises means for aligning each plate with a selected plate opening in line with the respective stamp.

9. A device as claimed in claim 8, characterized in that said plurality of openings in a plate are arranged in a line, and said means for aligning comprises a respective groove, in which a respective plate is slidable, associated with each respective cover opening.

10. A device as claimed in claim 3, characterized in that said plates each comprise at least a magnetic portion, and said cover comprises magnet element means for holding the supporting plates in position.

* * * * *